United States Patent
Dutartre et al.

(10) Patent No.: US 6,642,096 B2
(45) Date of Patent: Nov. 4, 2003

(54) BIPOLAR TRANSISTOR MANUFACTURING

(75) Inventors: Didier Dutartre, Meylan (FR); Alain Chantre, Seyssins (FR); Michel Marty, Saint Paul de Varces (FR); Sébastien Jouan, Echirolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/947,190

(22) Filed: Sep. 5, 2001

(65) Prior Publication Data

US 2002/0042178 A1 Apr. 11, 2002

(30) Foreign Application Priority Data

Sep. 7, 2000 (FR) .............................. 00/11419

(51) Int. Cl.$^7$ ......................... H01L 21/8249
(52) U.S. Cl. ................. 438/234; 438/235; 438/309; 438/312; 438/341; 438/369; 438/343
(58) Field of Search ................ 438/234, 235, 438/309, 312, 341, 369, 343

(56) References Cited

U.S. PATENT DOCUMENTS

| | | | |
|---|---|---|---|
| 3,855,009 A | * 12/1974 | Lloyd et al. | 438/480 |
| 4,908,324 A | * 3/1990 | Nihira et al. | 438/367 |
| 5,340,753 A | * 8/1994 | Bassous et al. | 438/366 |
| 5,516,710 A | * 5/1996 | Boyd et al. | 438/309 |
| 5,670,788 A | * 9/1997 | Geis | 257/10 |
| 5,959,333 A | 9/1999 | Gardner et al. | |
| 6,198,157 B1 | * 3/2001 | Ishida et al. | 257/607 |
| 6,319,786 B1 | * 11/2001 | Gris | 438/341 |
| 6,344,092 B1 | * 2/2002 | Takizawa | 148/33 |

FOREIGN PATENT DOCUMENTS

WO    WO 98/26457 A1    6/1998

OTHER PUBLICATIONS

French Search Report from French Patent Application No. 00/11419, filed Sep. 7, 2000.

Liefing R. et al., "Improved Device Performance By Multistep Or Carbon Co–Implants" IEEE Transactions on Electron Devices, US, IEEE Inc. New York, vol. 41, No. 1, 1994, pp. 50–55.

Lanzerotti L. D. et al., "Suppression of Boron Outdiffusion in Sige HBTS by Carbon Incorporation", International Electron Devices Meeting (IEDM), US, New York, IEEE, Dec. 8, 1996, pp. 249–252.

Knoll D. et al., "Comparison of SiGe and SiGe:C heterojunction bipolar transistors" Thin Solid Filsm, Elsevier–Sequoia S.A. Lausanne, CH, vol. 369, No. 1–2, Jul. 2000, pp. 342–346.

Kurata H. et al., "Shallow p–types SiGeC layers synthesized by ion implantation of Ge, C, and B in Si" Applied Physics Letters, Sep. 13, 1999, AIP, USA, vol. 75, No. 11, pp. 1568–1570.

* cited by examiner

Primary Examiner—Matthew Smith
Assistant Examiner—V. Yevsikov
(74) Attorney, Agent, or Firm—Wolf, Greenfield & Sacks, P.C.; James H. Morris; William R. McClellan

(57) ABSTRACT

A method of manufacturing a bipolar transistor in a single-crystal silicon substrate of a first conductivity type, including a step of carbon implantation at the substrate surface followed by an anneal step, before forming, by epitaxy, the transistor base in the form of a single-crystal semiconductor multilayer including at least a lower layer, a heavily-doped median layer of the second conductivity type, and an upper layer that contacts a heavily-doped emitter of the first conductivity type.

22 Claims, 1 Drawing Sheet

BIPOLAR TRANSISTOR MANUFACTURING

BACKGROUND OF THE INVENTION

1. Field of the Invention

The present invention relates to the manufacturing of junction components intended to be very fast and thus especially requiring a very thin base. The junction can be a homo-junction or a hetero-junction, that is, a junction between regions formed of a same semiconductor or of distinct semiconductors. More specifically, the present invention relates to the manufacturing of bipolar transistors with a silicon emitter and collector and a base formed by a silicon epitaxy (homo-epitaxy) or a silicon-germanium epitaxy (hetero-epitaxy).

2. Discussion of the Related Art

Upon formation of such a bipolar transistor, a P-type doped base is formed by epitaxy, on a single-crystal silicon semiconductor substrate of a first conductivity type, for example, N. In subsequent anneals, the P-type doping atoms, generally boron, tend to diffuse from the base layer, on the one hand, towards the underlying substrate (collector) and, on the other hand, towards the superposed emitter. It is thus difficult to obtain a base which is thin and heavily doped.

To enable reduction of the base thickness and, more specifically, to avoid the boron atoms placed in the base at the time of its formation diffuse into the underlying collector, it has been provided in unpublished French patent application No. 9,912,115 filed on Sep. 29, 1999 by France Télécom and the Commissariat à l'Energie Atomique, to implant carbon atoms into a silicon-germanium base.

It is indeed known that carbon atoms substitute to interstitial silicon atoms more easily than dopant atoms such as boron and limit the diffusion of boron.

However, the carbon must be implanted into the silicon-germanium base. Its implantation is thus performed at relatively high doses and powers (for example, 1015 atoms/$cm^2$ under 35 keV). Such an implantation creates many defects in the crystal lattice structure of the base. To enable reorganization of the lattice and totally "repair" such defects, the structure would have to be submitted to a relatively long anneal at a high temperature, which is impossible if the diffusion of boron is desired to be limited. The base thus inevitably has many crystal defects, which adversely affects the transistor performance. Such defects also appear in the case of a homo-junction transistor having a silicon base.

SUMMARY OF THE INVENTION

The present invention thus aims at providing a novel bipolar transistor manufacturing method which enables obtaining a thin and heavily-doped base.

The present invention also aims at such a method which enables obtaining a relatively homogeneous base with no defects.

To achieve these and other objects, the present invention provides a method of manufacturing a bipolar transistor in a single-crystal silicon substrate of a first conductivity type, including a step of carbon implantation at the substrate surface followed by an anneal step, before forming by epitaxy the transistor base in the form of a single-crystal semiconductor multilayer including at least a lower layer, a heavily-doped median layer of the second conductivity type, and an upper layer that contacts a heavily-doped emitter of the first conductivity type.

According to an embodiment of the present invention, the step of carbon implantation at the substrate surface includes implanting a dose of from 2 to $8.10^{14}$ atoms/$cm^2$ at a power lower than 20 keV, preferably ranging between 2 and 10 keV.

According to an embodiment of the present invention, the method further includes the steps of:

defining an emitter window;

depositing a conductive material to fill up the window, etching it and forming spacers at the periphery of the conductive material;

forming in the substrate, on either side of the window, an extrinsic base area; and annealing.

According to an embodiment of the present invention, the step of defining the emitter window includes the steps of:

depositing a first insulating layer;

depositing a second insulating layer selectively etchable with respect to the first layer; and etching the first and second insulating layers to partially expose a selected region of the upper layer.

According to an embodiment of the present invention, the first insulating layer is silicon oxide and the second insulating layer is silicon nitride.

According to an embodiment of the present invention, the multilayer is made of silicon.

According to an embodiment of the present invention, the multilayer includes germanium.

According to an embodiment of the present invention, the lower layer is a silicon-germanium layer of a thickness on the order of 20 nm; the median layer is a silicon-germanium layer of a thickness on the order of 10 nm; and the upper layer is a silicon or silicon-germanium layer of a thickness on the order of 15 nm.

The present invention also provides a bipolar heterojunction transistor, including a collector buried in a silicon substrate, a silicon base multilayer formed by epitaxy on the substrate and underlying a silicon emitter, the substrate surface further including an area in which carbon atoms are present.

According to an embodiment of the present invention, the multilayer includes germanium.

The foregoing objects, features and advantages of the present invention will be discussed in detail in the following non-limiting description of specific embodiments, in conjunction with the accompanying drawings.

DETAILED DESCRIPTION

As usual in the representation of integrated circuit, the drawings are not to scale. Further, the same references designate the same elements.

Figure 1A:
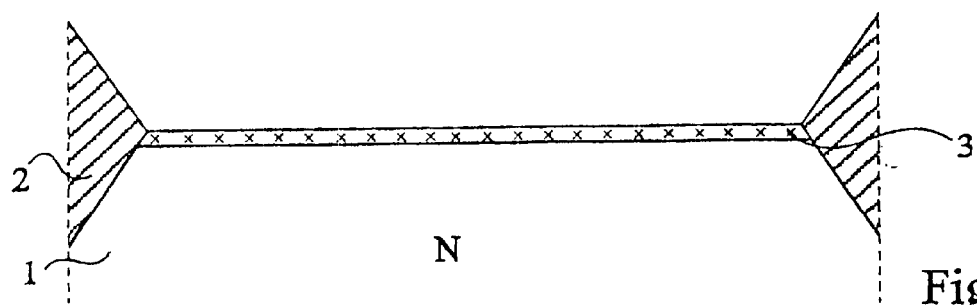
FIGS. 1A to 1D illustrate, in a partial simplified cross-section view, a bipolar transistor at different steps of its manufacturing according to the present invention.

As illustrated in FIG. 1A, an active region is first defined in a silicon substrate 1. The active region is delimited, for example, by silicon oxide ($SiO_2$) field insulation areas 2. Substrate 1 is lightly doped and of a first conductivity type, for example N. The substrate is intended for forming the collector of the final bipolar transistor. According to the present invention, carbon is implanted into substrate 1. This implantation is performed at small dose and low power in a surface area 3 of small thickness. Area 3 is, for example, formed by implanting from 1 to $10.10^{14}$ atoms/$cm^2$, preferably from 2 to $8.10^{14}$ at./$cm^2$, of carbon at a power under 20 keV, preferably between 2 and 10 keV.

An anneal for "repairing" the surface defects of substrate 1 caused by the carbon implantation is then performed. Such an anneal is performed in temperature conditions adapted to enable homogeneous recrystallization of the substrate while avoiding formation therein of silicon carbide (SiC) precipitates. This anneal can be performed with no specific constraints since, at this manufacturing stage, the structure includes no junction. Further, the carbon implantation being performed at low power and low dose, the proportion of defects is relatively small. An anneal at a temperature on the order of 900° C. for approximately 30 s may for example be performed.

Figure 1B:
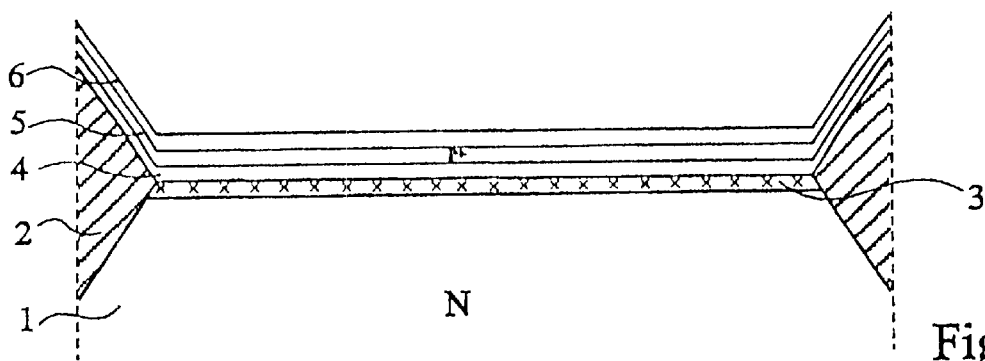

At the next steps, illustrated in FIG. 1B, a single-crystal semiconductor base multilayer T is formed by successive epitaxial depositions. Multilayer T includes at least, from bottom to top, a lower layer 4 in contact with substrate 1, that is, with surface layer 3 including the carbon atoms, a median layer 5 and an upper layer 6. Lower layer 4 is undoped or slightly doped. Median layer 5 is very heavily doped and of the conductivity type opposite to that of underlying substrate 1. For example, layer 5 is P-type doped (P+), for example with boron. Upper layer 6 may be P-type doped.

Figure 1C:
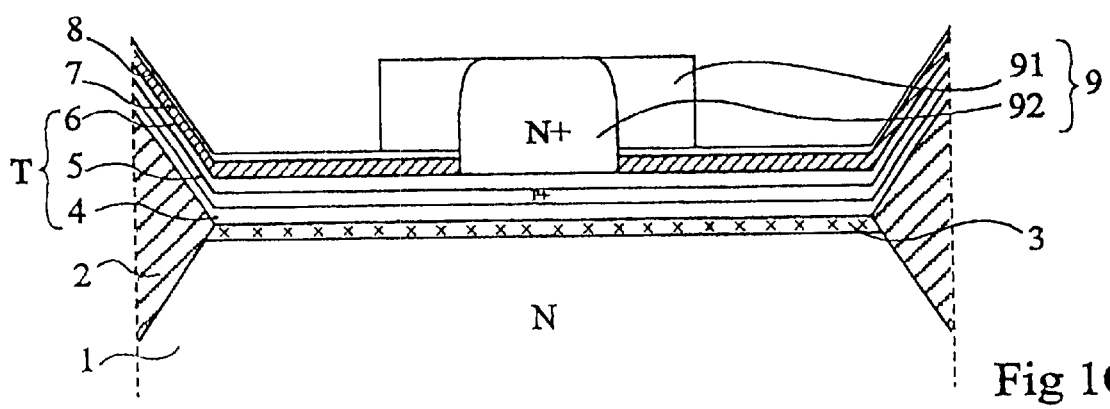

At the next steps illustrated in FIG. 1C, a layer 7 of a first insulating material, followed by a layer 8 of a second insulating material, are successively deposited. The first and second materials are selectively etchable with respect to each other. Layer 7 is selectively etchable with respect to upper layer 6 of underlying multilayer T. The insulating materials of layers 7 and 8 are also selectively etchable with respect to a subsequently-deposited material.

Layer 7 and 8 are etched to define an emitter window. N-type dopants are then implanted at high dose and high energy to form, in substrate 1, under the emitter window, a buried collector area (not shown).

A silicon layer 9 is then deposited to form an emitter. Layer 9 is then etched to extend beyond either side of the emitter window (FIG. 1C shows the structure after this etching). The emitter region 9 thus formed has, above base-emitter junction 6-9, a single-crystal structure area 91 and, on insulating layer 8, a multiple-crystal or amorphous structure area 92. Emitter region 9 is heavily doped of type N, for example, with arsenic.

Figure 1D:
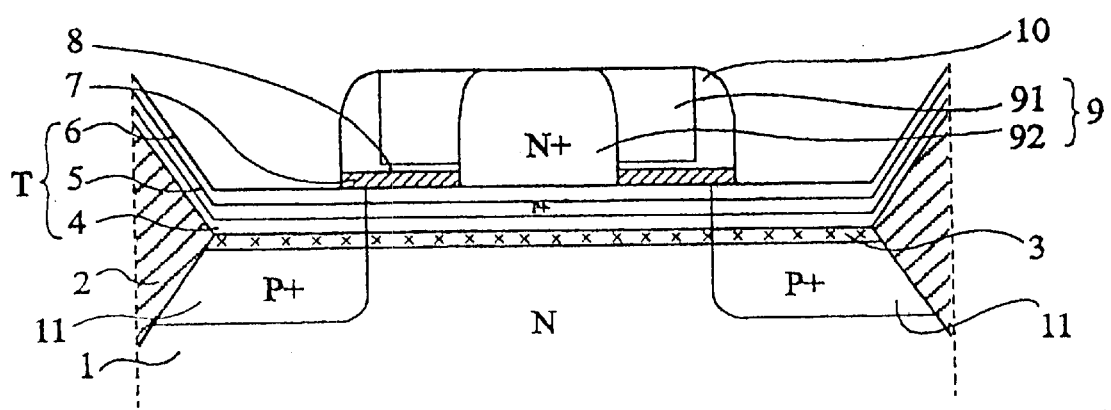

At the next steps, illustrated in FIG. 1D, a spacer 10 is formed around emitter region 9. Spacer 10 is, for example, of same nature as underlying insulating layer 8. Said layer is then simultaneously removed everywhere, except around emitter 9, under spacer 10, as well as the underlying portions of layer 7.

Boron is then implanted at high dose on either side of emitter region 9 and of underlying collector-base junction 1-4. A heavily-doped extrinsic base region 11 of the transistor is thus formed.

This implantation forming extrinsic base 11 must be followed by an activation anneal. During this anneal, doping boron atoms tend to diffuse and thus to widen the heavily-doped base region 5 by having boron atoms dope the portion of N layer 4 and of substrate 1 under region 5 in the area located under the emitter window. This diffusion would result from a double phenomenon: direct vertical diffusion of the boron atoms and lateral diffusion of interstitial silicon atoms from the disturbed region where the extrinsic base implantation has been performed, these interstitial atoms then favoring the diffusion of boron from layer 5 to layer 4 and substrate 1.

The carbon atoms located in region 3 appear to enable thwarting the two above-mentioned effects. Thus, carbon atoms, by their reaction with the interstitial silicon atoms, enable blocking the diffusion of these interstitial atoms, but probably also have an effect upon the direct diffusion of boron.

Thus, the present invention enables submitting the structure to an anneal of a duration and temperature appropriate to an adequate activation of the arsenic in emitter 9 and of the boron in extrinsic base 11 without causing any undesirable extension of the intrinsic base. In the case of a BICMOS technology, this anneal can also be adapted to the activation of boron and of arsenic in MOS transistors. All other things being equal, the carbon of surface area 3 of substrate 1 (collector) thus enables reducing the thickness of the base with respect to a transistor obtained with conventional methods. Due to the carbon of area 3, it is also advantageously possible to increase the doping median layer 5 without causing any widening of the base with respect to a transistor obtained with conventional methods. The performances of the resulting transistors are improved.

As an non-limiting example, base multilayer T may include a lower silicon-germanium layer 4 having a thickness on the order of 20 nm, a silicon-germanium intrinsic base median layer 5 having a thickness on the order of 10 nm, and an upper silicon or silicon-germanium layer 6 with a thickness on the order of 15 nm. Layer 7 is a silicon oxide layer. Layer 8 is a silicon nitride layer ($Si_3N_4$). Spacer 10 is made of silicon nitride and enables spacing extrinsic base 11 apart from collector-base junction 1-4 by approximately 0.2 μm.

Of course, the present invention is likely to have various alterations, modifications, and improvements which will readily occur to those skilled in the art. In particular, the foregoing description relates to a specific case of formation of a bipolar transistor with a silicon/silicon-germanium hetero-junction as a non-limiting example only. Those skilled in the art should understand that the specific described method can be adapted according to the considered technological process. For example, the base multilayer may include an additional undoped silicon layer interposed between the substrate (collector) and lower undoped or slightly doped silicon germanium layer 4.

Further, those skilled in the art should understand that the present invention relates to the forming of any junction by epitaxy of a single-crystal layer on a single-crystal substrate. Thus, as also indicated previously, the present invention not only applies to hetero-junction components, but also to homo-junction components. For example, the base multilayer may be formed by epitaxy of various silicon layers, each of these layers being doped differently.

In other words, and more generally, the base multilayer is formed of various regions of a first single-crystal semiconductor (silicon in the considered case) in which profiles of dopants (boron) and of at least one second single-crystal semiconductor (germanium) distinct from the first one may be adapted in any appropriate manner according to the technological line and to the desired performances. The germanium and boron profiles may be complex and include areas with a gradual composition.

Further, before any implantation operation, a specific step of formation of a thin sacrificial protection and surface reconcentration insulator may be provided. For example, before forming surface area 3 including carbon, a silicon oxide will be grown by fast thermal processing. This sacrificial oxide will be subsequently removed before the base forming epitaxy.

Moreover, the forming of the buried collector may be carried out in two implantations, a first implantation being performed before formation of area 3, and followed by the implantation through the window such as previously described.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a bipolar transistor using a single-crystal silicon substrate of a first conductivity type, including steps of:

implanting carbon at a surface of the substrate;

annealing the substrate; and after the step of annealing, forming, by epitaxy, a transistor base in the form of a semiconductor multilayer including at least a lower layer, a heavily-doped median layer of a second conductivity type, and an upper layer that contacts a heavily-doped emitter of the first conductivity type, wherein a collector of the bipolar transistor corresponds to an upper portion of the substrate under the transistor base.

2. The method of claim 1, wherein the step of implanting carbon at the surface of the substrate includes implanting a dose at or between $2.10^{14}$ atoms/cm$^2$ and $8.10^{14}$ atoms/cm$^2$ at lower than 20 keV.

3. The method of claim 2, wherein the step of implanting carbon at the surface of the substrate includes implanting carbon between 2 keV and 10 keV.

4. The method of claim 1, further including the steps of:

defining an emitter window;

depositing a conductive material to fill up the emitter window, etching the conductive material, and forming spacers at a periphery of the conductive material;

forming in the substrate, on either side of the emitter window, an extrinsic base area; and annealing the extrinsic base area.

5. The method of claim 4, wherein the step of defining the emitter window includes the steps of:

depositing a first insulating layer;

depositing a second insulating layer selectively etchable with respect to the first insulating layer; and etching the first and second insulating layers to partially expose a selected region of the upper level.

6. The method of claim 5, wherein the first insulating layer is silicon oxide and the second insulating layer is silicon nitride.

7. The method of claim 1, wherein the semiconductor multilayer is made of silicon.

8. The method of claim 1, wherein the semiconductor multilayer includes germanium.

9. The method of claim 1, wherein:

the lower layer is a silicon-germanium layer of a thickness on the order of 20 nm;

the median layer is a silicon-germanium layer of a thickness on the order of 10 nm; and the upper layer is a silicon or silicon-germanium layer of a thickness on the order of 15 nm.

10. A bipolar hetero-junction transistor, including a collector buried in a silicon substrate, a silicon base multilayer formed by epitaxy on the substrate and underlying a silicon emitter, a surface of the substrate further including an area in which carbon atoms are present.

11. The transistor of claim 10, wherein the multilayer includes germanium.

12. A method of forming a semiconductor device, comprising acts of:

implanting a substrate comprising a first region of the semiconductor device with carbon atoms, wherein the first region is of a first conductivity type; and depositing an epitaxial layer above the substrate, wherein the epitaxial layer comprises a second region of the semiconductor device, and wherein the second region is of a second conductivity type.

13. The method of claim 12, wherein the act of implanting includes implanting the substrate with carbon atoms in a manner that inhibits diffusion of dopant atoms of the second conductivity type from the epitaxial layer into the substrate.

14. The method of claim 13, wherein the act of implanting includes implanting the substrate with carbon atoms in a manner that inhibits diffusion of boron atoms from the epitaxial layer into the substrate.

15. The method of claim 12, further comprising an act of:

annealing the substrate before the act of depositing the epitaxial layer.

16. The method of claim 15, wherein the act of annealing includes annealing the substrate at a temperature that inhibits formation of silicon carbide precipitates.

17. The method of claim 12, further comprising acts of:

depositing at least one insulating layer above the epitaxial layer; and forming an opening in the at least one insulating layer.

18. The method of claim 17, further comprising an act of:

forming a third layer at least partially in the opening, wherein the third layer comprises a third region of the first conductivity type.

19. The method of claim 18, further comprising an act of implanting a dopant of the second conductivity type into the epitaxial layer on a side of the third layer to form a fourth region.

20. The method of claim 19, further comprising an act of:

annealing the semiconductor device at a temperature sufficient to activate the dopant of the second conductivity type.

21. The method of claim 12, wherein the act of depositing includes depositing an epitaxial layer having a heavily doped portion.

22. The method of claim 21, wherein the act of depositing includes depositing an epitaxial layer having at least three layers, wherein a middle layer is heavily doped.

* * * * *